United States Patent [19]
Kohiki et al.

[11] Patent Number: 5,422,304
[45] Date of Patent: Jun. 6, 1995

[54] METHOD FOR PRODUCING A THIN FILM, AND A SEMICONDUCTOR DEVICE HAVING THE THIN FILM

[75] Inventors: Shigemi Kohiki; Takayuki Negami, both of Osaka; Mikihiko Nishitani, Nara; Takahiro Wada, Katano, all of Japan

[73] Assignee: Matsushita Electric Industrial Co., Ltd., Kadoma, Japan

[21] Appl. No.: 309,552

[22] Filed: Sep. 20, 1994

Related U.S. Application Data

[63] Continuation of Ser. No. 951,229, Sep. 25, 1992, abandoned.

[30] Foreign Application Priority Data

Sep. 27, 1991 [JP] Japan .................................. 3-249022
May 28, 1992 [JP] Japan .................................. 4-136571

[51] Int. Cl.⁶ .......................................... H01L 21/20
[52] U.S. Cl. .................................. 437/105; 437/965;
117/108; 136/258; 136/265
[58] Field of Search ................ 437/105, 965; 117/108;
136/258, 265

[56] References Cited

U.S. PATENT DOCUMENTS

| 4,004,342 | 1/1977 | Park et al. | 29/590 |
| 4,335,266 | 6/1982 | Mickelson et al. | 136/265 |
| 4,392,451 | 7/1983 | Mickelson et al. | 118/690 |
| 4,465,575 | 8/1984 | Love et al. | 136/265 |
| 4,523,051 | 6/1985 | Mickelson et al. | 136/265 |
| 4,680,422 | 7/1987 | Staubery | 136/258 |
| 4,684,761 | 8/1987 | DeVaucy | 136/265 |
| 5,137,835 | 8/1992 | Karg | 136/265 |
| 5,141,564 | 8/1992 | Chen et al. | 136/258 |

FOREIGN PATENT DOCUMENTS

92116441 7/1992 European Pat. Off. .

OTHER PUBLICATIONS

Kapur et al. "Low Cost Methods for the Production of Semiconductor Films for CuIm Seg/Cds Solar Cells" in Solar Cells 21, 65–72 (1987).
Murali "Preparation and Characterisation of Chemically Deposited Films" in Thin Solid Films, 167, L19–L22 (1988).
Journal of Electronic Materials, vol. 20, No. 9, Sep. 1991 pp. 659–663.
Tomlinson et al. "Changes in opto–electronic properties of $CuInSe_2$. . .".
Medvedkia et al., "Diode mp $CuInSe_2$ Structures Fabricated by Oxygen Implantation", Cryst. Res. Techol. vol. 25, No. 11 pp. 1299–1302.
"Nitrogen Implantation for Molecular Beam Deposited $CuInSe_2$ Thin Films", Kohiki et al., Appl. Phys. Lett. 59 (14), 30 Sep. 1991, pp. 1749–1751.
"Current/Voltage Characteristic of $CuInSe_2$ Homojunctions", Electronics Letters, 11 Apr. 1985, vol. 21, No. 8, pp. 350–351; I. Shih et al.

(List continued on next page.)

Primary Examiner—R. Bruce Breneman
Assistant Examiner—Ramamohan Rao Paladugu
Attorney, Agent, or Firm—Renner, Otto, Boisselle & Sklar

[57] ABSTRACT

Chalcopyrite compound semiconductor thin films represented by $I$-$III$-$VI_{2-x}V_x$ or $I$-$III$-$VI_{2-x}VII_x$, and semiconductor devices having a $I$-$III$-$VI_2$/$I$-$III$-$VI_{2-x}V_x$ or $I$-$III$-$VI_2$/$I$-$III$-$VI_{2-x}VII_x$ chalcopyrite homojunction are provided. Such chalcopyrite compound semiconductor thin films are produced by radiating molecular beams or ion beams of the I, III, VI, and V or VII group elements simultaneously, or by doping $I$-$III$-$VI_2$ chalcopyrite thin films with VII-group atoms after the formation thereof. Pollution-free solar cells are also provided, which are formed by the steps of forming a structure of a lower electrode, a chalcopyrite semiconductor thin film, and an upper electrode and radiating accelerated ion beams of a V, VII, or VIII group element thereto.

9 Claims, 6 Drawing Sheets

OTHER PUBLICATIONS

"Extrinsic p-Type Doping of CuInSe2", Shing et al., pp. 774–775, Floula, May 1–4, 1984 (17th IEEE Photovolatic Specialists Conference).

"X-Ray Photoelectron Spectroscopy of Cu–In–Se–N and Cu–In–Se Thin Films", Kohiki et al., J. Mater Res. vol. 7, No. 8, Aug. 1992, pp. 1984.

Landolt–Bornstein, (Numerical Data and Functional Relationships in Science and Technology) vol. 17, pp. 26–29, "Semiconductors".

J. Meakin, SPIE vol. 543, Photovolatics, pp. 108–118, 1985, "Status of CuInSe$_2$ Solar Cells".

B. Abid et al., Nineteenth IEEE Photovolatic Specialists Conference, 1987, pp. 1305–1308, "CuInS$_{2y}$Se$_{2-2y}$ and CuGa$_x$In$_{1-x}$Se$_2$: Bulk Crystal Growth Conditions and Properties".

METHOD FOR PRODUCING A THIN FILM, AND A SEMICONDUCTOR DEVICE HAVING THE THIN FILM

This is a continuation of application Ser. No. 07/951,229, filed on Sep. 25, 1992, now abandoned.

BACKGROUND OF THE INVENTION

1. Field of the Invention:

The present invention relates to chalcopyrite compound semiconductors (semiconducting compounds) usable for high-efficiency thin-film solar cells, nonlinear optical elements, or the like.

2. Description of the Prior Art:

CuInSe$_2$ belongs to the I-III-VI$_2$ family of chalcopyrite semiconducting compounds. This compound is used as an absorber layer in thin-film solar cells which have very high efficiencies and long-term stable characteristics. Compound semiconductors having a chalcopyrite structure in which atoms are replaced with homologous ones, represented by:

wherein I and I', III and III', and VI and VI' are homologous elements belonging to the same groups, respectively, are known. It is known that when some atoms of the I, III, and VI groups constituting the base of a chalcopyrite crystal structure are replaced with homologous ones, electrical, optical, and other various properties of the crystal change.

However, chalcopyrite compound semiconductors in which atoms of a VI-group element are replaced with those of an element of a different group, for example, the V or VII group, represented by I-III-VI$_{2-x}$V$_x$ or I-III-VI$_{2-x}$VII$_x$ have not been reported.

Generally, when a p-n junction is formed by two semiconductor thin films of chalcopyrite compound represented by:

in which some atoms are replaced homologous ones, or that of a non-stoichiometric chalcopyrite compound represented by:

wherein x+y=2, many defects are produced at the junction because of the difference in the lattice constant, the crystal orientation of grains with respect to the surface of the substrate, and the surface morphology at the junction. As a result, high density recombination centers are produced near the p-n junction, causing deterioration of the properties of resultant semiconductor devices such as solar cells and optical sensors.

One purpose of the present invention is to provide semiconductor devices with improved properties in which the lattice constant, the crystal orientation of grains with regard to the substrate surface, and the surface morphology are matched at the p-n junction in a I-III-VI$_2$ chalcopyrite compound semiconductor thin films by using a semiconductor thin film of chalcopyrite compounds represented by I-III-VI$_{2-x}$V$_x$ or I-III-VI$_{2-x}$V$_{IIx}$. For simplification, hereinafter, the I-III-VI$_2$ chalcopyrite compounds also include those in which some atoms are replaced with homologous ones and those having a non-stoichiometric composition.

Also, the I-III-VI$_{2-x}$V$_x$ or I-III-IV$_{2-x}$VII$_x$ chalcopyrite compounds also include those in which some atoms are replaced with homologous ones and those having a nonstoichiometric composition.

The chalcopyrite compound semiconductor thin films represented by I-III-IV$_2$ are not good in adhesion to a substrate such as glass or a metal film on the glass. Thus arise a big problem arises when semiconductor devices are actually fabricated.

Figure 1:
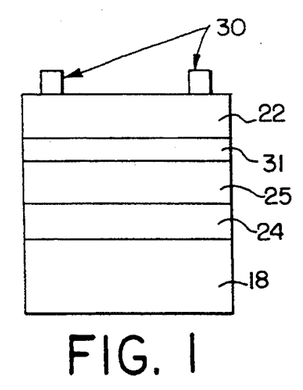
FIG. 1 shows the structure of a conventional CdS/CuInSe$_2$ hetero junction solar cell.

When semiconductor thin films of conventional chalcopyrite compounds such as CuInSe$_2$ are used for optoelectro transducers such as solar cells, a heterojunction of CdS/CuInSe$_2$, for example, is formed as shown in FIG. 1. FIG. 1 shows a structure of a conventional solar cell which comprises a glass substrate 18, and a lower electrode 24 made of Mo, a p-type CuInSe$_2$ layer 25 having a thickness of 2 μm, an n-type CdS layer 31 having a thickness of 1 μm, and a ZnO layer 22 having a thickness of 2–3 μm formed in this order on the substrate 18. An upper metal electrode 30 is then formed on the ZnO layer 22. This structure causes failure in the lattice matching at the junction and the resultant production of high density recombination centers, which deteriorate the properties of the semiconductor devices.

To solve the aforementioned problem and to improve the properties of semiconductor devices, a yet another purpose of the present invention, which is realized by forming a homojunction in a chalcopyrite compound semiconductor thin film by doping the thin film with molecular beams or ion beams during the formation of the thin film, or by doping the thin film with accelerated ions after the formation of the structure of an optoelectro transducer or the like. Moreover, solar cells, for example, the chalcopyrite compounds semiconductor thin films having the homojunction according to the present invention do not contain toxic Cd. Thus, they can contribute to energy saving and environmental protection.

SUMMARY OF THE INVENTION

The compound semiconductor of the present invention comprises a chalcopyrite compound semiconductor represented by I-III-VI$_{2-x}$V$_x$ or I-III-VI$_{2-x}$VIII$_x$.

The method for producing a compound semiconductor thin film of the present invention comprises the step of forming a chalcopyrite thin film represented by I-III-VI$_{2-x}$V$_x$, I-III-VI$_{2-x}$VII$_x$, or I-III-VI$_2$ on a substrate in a vacuum chamber by use of molecular beams or ion beams of I, III, VI, and V, VII, or VIII group elements, respectively.

The semiconductor device of the present invention has a chalcopyrite homojunction of I-III-VI$_{2-x}$V$_x$ and I-III-VI$_2$, I-III-VI$_{2-x}$V$_x$ and I-III-VI$_{2-x}$VII$_x$, and I-III-VI$_2$ and I-III-VI$_{2-x}$VII$_x$.

In another aspect of the present invention, a method for fabricating an optoelectro transducer is provided, which comprises the steps of forming an electrode over a substrate, forming a chalcopyrite thin film represented by I-III-VI$_2$ on the electrode, forming an electrode on the chalcopyrite thin film, and forming a homojunction in the chalcopyrite thin film by doping the chalcopyrite thin film with ions of an element which is selected from the group of a V, VIII, or VIII group element.

In accordance with the present invention, some atoms of the VI group are replaced with those of the V or VII group to provide chalcopyrite compounds represented by:

or such compounds will be able to provide a variety of properties useful for the design of various types of semiconductor devices. The V and VII groups include N, P, As, Sb, and Bi, and F, Cl, Br, and I, respectively. Some atoms of the V or VII group in the above compound can be further replaced with those in the same group, so as to provide a further widened variety of properties.

Thus, the invention described herein makes possible the advantages of (1) providing a chalcopyrite compound semiconductor thin film having a homojunction at which the lattice constants are matched and defects are minimized and a semiconductor device fabricated using such a film to improve the properties thereof, (2) providing a chalcopyrite compound semiconductor thin film having a good adhesion to a glass substrate and the like, and (3) providing an optoelectro transducer with improved properties comprising a chalcopyrite compound semiconductor thin film in which a homojunction is formed.

These and other advantages of the present invention will become apparent to those skilled in the art upon reading and understanding the following detailed description with reference to the accompanying figures.

DESCRIPTION OF THE PREFERRED EMBODIMENTS

Example 1

In this example, a CuInSe$_2$ chalcopyrite compound semiconductor is used, and a CuInSe$_{2-x}$N$_x$ thin film is produced by the partial replacement of Se (a VI-group element) in the CuInSe$_2$ with N (a V-group element).

Figure 2:
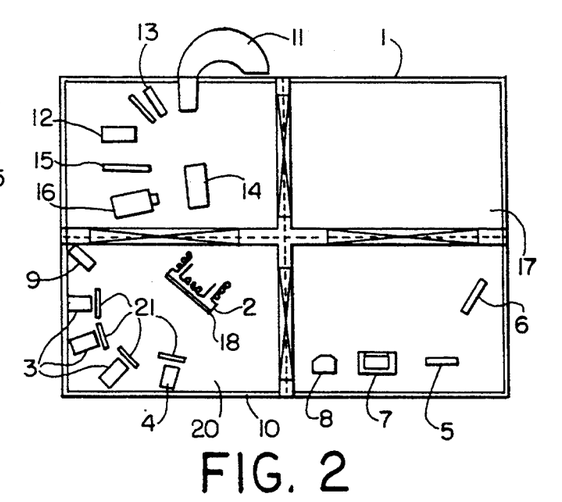
FIG. 2 is a schematic sectional view of an apparatus used for producing a compound semiconductor thin film according to the present invention.

FIG. 2 shows an apparatus for producing compound semiconductor thin films and the compound semiconductor devices of this example according to the present invention. The apparatus comprises an ultrahigh vacuum chamber 1 composed of four sub-chambers. One of the sub-chambers is a thin film producing chamber 20 which includes a substrate holder 2 capable of being heated and cooled, and molecular beam sources 3 and an ion source 4 for I, III, VI, and V group elements that are components of the I-III-VI$_{2-x}$V$_x$ compound semiconductor thin film (in this example, Cu, In, Se, and N, respectively). The vacuum chamber 1 also includes components required for film formation by sputtering and electron beam irradation to fabricate a semiconductor device. These components include a target 5 for sputtering, an ion gun 6, a target 7 for electron beam evaporation, and electron gun 8, another electron gun 9 for thin film monitoring, a fluorescent screen 10, an electron energy analyzer 11, an X-ray source 12, and ion gun 13, a mass analyzer 14, a laser light source 15, a spectroscope 16, and an atmospherically controlled sample treatment sub-chamber 17.

The base pressure in the ultra-high vacuum chamber 1 is lowered to $10^{-10}$ millibars by using a rotary pump, an oil diffusion pump, an ion pump, a turbo pump, a Ti sublimation pump, and the like jointly. Silica glass of which surface is degreased and cleaned is used as a substrate 18. Mo is deposited on the surface of the silica glass substrate by electron beam evaporation using the target 7 for electron beam evaporation and the electron gun 8 so as to form an Mo electrode layer on the substrate 18. The substrate 18 with the Mo electrode layer formed thereon is then mounted on the substrate holder 2 in the thin film producing chamber 20. Then, a semiconductor device with CuInSe$_{2-x}$N$_x$/CuInSe$_2$ thin film p-n homojunction is fabricated in the following procedure.

First, an n-type CuInSe$_2$ layer of a thickness of about $5 \times 10^{-7}$ m and then a CuInSe$_{2-x}$N$_x$ layer of a thickness of about $10^{-5}$ m are formed on the Mo electrode layer in this order. As the molecular beam sources 3 or ion beam sources 4 for Cu, In, Se, and N, solid Knudsen cells, gas Knudsen cells, liquid source utilizing vapor pressure, or halogenated metals can be used. In this example, Cu, In, and Se metals are used for the respective molecular beam sources 3. Each metal is evaporated by heating. A cover having a small hole is placed on each source 3 so that the metal vapor is injected through the hole directly to the surface of the substrate 18 on the holder 2. A shutter 21 is formed between the substrate 18 and each source 3.

Nitrogen gas is used for the N ion beam source 4. The gas is heated and subjected to repeated electron bombardments so as to produce high-density plasma. The plasma is converged and the ions in the plasma are accelerated by a two-stage lens system, followed by mass separation through a fan-shaped magnetic field to select N+ ions from the ions in the plasma, which are then converged by a multi-stage lens system and soon decelerated. The decelerated N ion beams scan over the surface of the substrate 18.

When the $CuInSe_{2-x}N_x$ layer and the $CuInSe_2$ layer are formed sequentially, switching on/off of the N ion beam source 4, adjustment of the intensity of Cu, In, and Se molecular beams, and adjustment of the temperature of the substrate holder 2 are required. On the other hand, when the $CuInSe_2$ layer has been formed previously or a $CuInSe_2$ single crystal layer is used as the substrate 18, the $CuInSe_{2-x}N_x$ layer of a desired thickness must be formed in the surface region of the $CuInSe_2$ layer. In this case, the acceleration energy of N ion beams can be increased at the final stage of the lens system to reach an appropriate acceleration energy corresponding to a projection range where a desired thickness of the $CuInSe_{2-x}N_x$ layer can be formed in the $CuInSe_2$ layer. For example, to make the p-type layer having a thickness of about $10^{-6}$ m, the acceleration energy is increased to about $10^4$ electron volts. In this example, the acceleration energy of N ions was 50 electron volts, and the temperature of the substrate holder 2 was raised to 650° K. and 750° K. for the formation of the $CuInSe_2$ layer and the $CuInSe_{2-x}N_x$ layer, respectively. The intensity of Cu, In, and Se molecular beams was adjusted by adjusting the temperature of the respective Knudsen cells in the range of 1400–1450 K., 1100–1150 K. and 400–450 K., respectively. The intensity of molecular beams were monitored by an ion monitor which provided more precise results than a film thickness meter using a quartz oscillator.

A ZnO layer is used as both a transparent electrode layer and a protective layer for the p-type $CuInSe_{2-x}N_x$ layer that is to be a light absorption layer. The ZnO transparent electrode layer is formed on the surface of the $CuInSe_{2-x}N_x$ layer by sputtering the target 5 for ZnO with Ar ions from the ion gun 6. Likewise, an ITO transparent electrode layer is formed on the ZnO layer by sputtering an target for ITO with Ar ions from the ion gun 6. Then, the resultant multi-layer struture is placed in the sample treatment sub-chamber 17 for heat treatment at a temperature of 400 K. for one hour with $10^{-5}$ millibar oxygen supplied therein.

Figure 3:
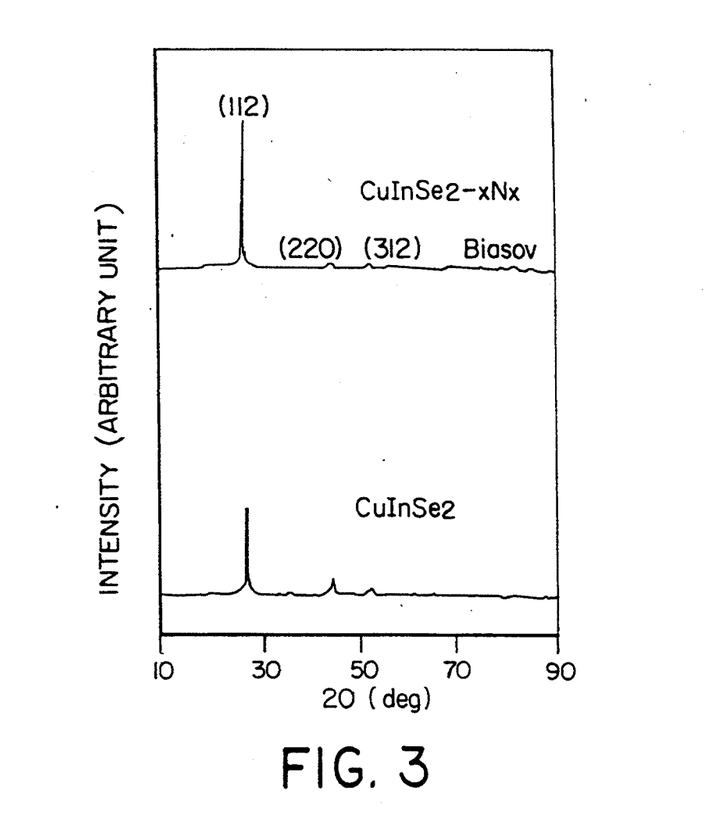
FIG. 3 is an X-ray diffraction diagram of each CuInSe$_{2-x}$N$_x$ and CuInSe$_2$ produced according to the method of the present invention.
Figure 4:
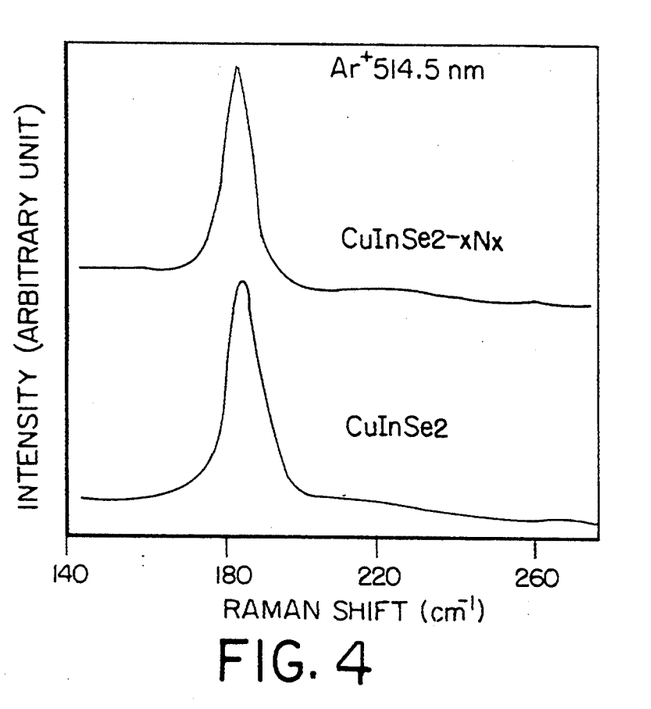
FIG. 4 is a Raman scattering spectrum of each CuInSe$_{2-x}$N$_x$ and CuInSe$_2$ produced according to the method of the present invention.

FIGS. 3 and 4 respectively show an x-ray diffraction diagram and a Raman scattering spectrum of each $CuInSe_{2-x}N_x$ and $CuInSe_2$. It is shown from these figures that the compound semiconductor thin film obtained by the method described above has the lattice constants matching with each other at the junction formed in the same crystal structure, and is free from segregation of intermetallic compounds and production of different types of compounds from the chalcopyrite structure.

Table 1 shows the conductivity and the conductivity type of each Sample A ($CuInSe_{2-x}N_x$) and Sample B ($CuInSe_2$). This table shows that, while the stoichiometric $CuInSe_2$ chalcopyrite compound is an n-type having a high resistance, the $CuInSe_{2-x}N_x$ that is also stoichiometric chalcopyrite compound is a p-type with a low resistance by the partial replacement of Se with N.

TABLE 1

| | Conductivity (/Ωcm) | Conductivity type |
|---|---|---|
| Sample A | 2.5 | p-type |

TABLE 1-continued

| | Conductivity (/Ωcm) | Conductivity type |
|---|---|---|
| Sample B | $1 \times 10^{-4}$ | n-type |

Figure 5:
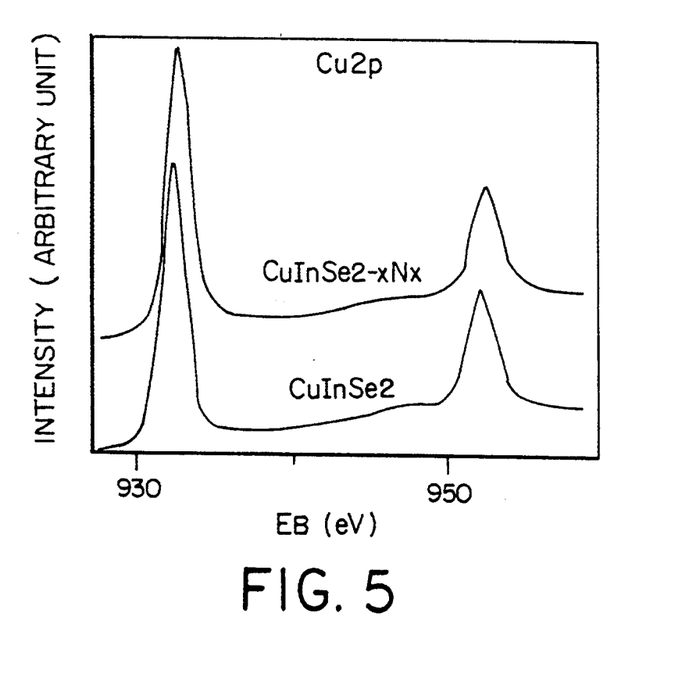
FIG. 5 is an X-ray photoelectron spectrum at the Cu$_{2p}$ Level of each CuInSe$_{2-x}$N$_x$ and CuInSe$_2$ produced according to the method of the present invention.
Figure 6:
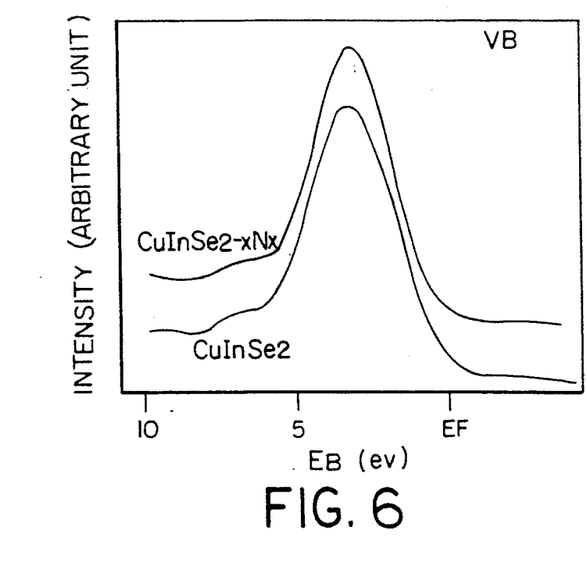
FIG. 6 is an X-ray photoelectron spectrum at the valence band of each CuInSe$_{2-x}$N$_x$ and CuInSe$_2$ produced according to the method of the present invention.

FIGS. 5 and 6 show X-ray photoelectron spectra of $CuInSe_{2-x}N_x$ and $CuInSe_2$ at the $Cu_{2p}$ level and the valence band, respectively. It is found from these figures that the holes formed in the valence band of $CuInSe_2$ due to the partial replacement of Se with N are localized on the Se crystal site and positioned on the $Cu_d$-$Se_p$ antibonding molecular orbital that is the highest occupied level, thereby determining the electrical properties of the compound.

Figure 7:
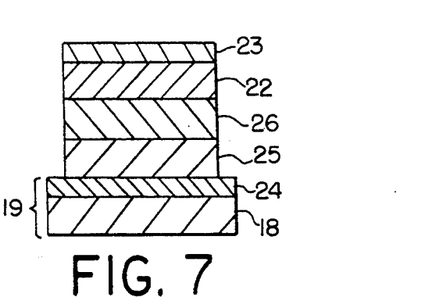
FIG. 7 is a sectional view showing an application of the present invention to a solar cell.

FIG. 7 shows one example of a solar cell using the $CuInSe_{2-x}N_x/CuInSe_2$ thin film produced by the aforementioned method. The solar cell has a substrate 18, an Mo layer 24, a $CuInSe_2$ layer 25, a $CuInSe_{2-x}N_x$ layer 26, a ZnO transparent layer 22, and an ITO transparent layer 23. The thin films 25 and 26 produced according to the method of the present invention have good orientation on the crystal surface, the lattice constants of the films 25 and 26 at the p-n homojunction between the films 25 and 26 can be matched with each other, and the number of defects produced at the junction can be reduced. Further, segregation of excessive components, production of different types of compounds, or other phenomena that may badly affect the electric properties of the resultant device are avoided. Therefore, highly efficient solar cells can be obtained.

Example 2

In this example, a $CuInSe_2$ chalcopyrite compound semiconductor is used, and a thin film of $CuInSe_{2-x}P_x$, $CuInSe_{2-x}Sb_x$ or $CuInSe_{2-x}Bi_x$ is produced by the partial replacement of Se (a VI-group element) in the $CuInSe_2$ with P, Sb, or Bi (a V-group element).

FIG. 2 shows an apparatus for producing the compound semiconductor thin films and the compound semiconductor devices of this example according to the present invention. The apparatus comprises an ultra-high vacuum chamber 1 composed of four sub-chambers. One of the sub-chambers is a thin film producing chamber 20 which includes a substrate holder 2 capable of being heated and cooled, and molecular beam sources 3 and an ion source 4 for I, III, VI, and V group elements that are components of the $I-III-VI_{2-x}V_x$ compound semiconductor thin film (in this example, Cu, In, Se, and P, Sb, or Bi, respectively). The vacuum chamber 1 also includes components required for film formation by sputtering and electron beam irradiation to fabricate a semiconductor device. These components include a target 5 for sputtering, an ion gun 6, a target 7 for electron beam evaporation, an electron gun 8, another electron gun 9 for thin film monitoring, a fluorescent screen 10, an electron energy analyzer 11, an X-ray source 12, and ion gun 13, a mass analyzer 14, a laser light source 15, a spectroscope 16, and an atomospherically controlled sample treatment sub-chamber 17.

The base pressure in the ultra-high vacuum chamber 1 is lowered to $10^{-10}$ millibars by using a rotary pump, an oil diffusion pump, an ion pump, a turbo pump, a Ti sublimation pump, and the like jointly. Silica glass of which surface is degreased and cleaned is used as a substrate 18. Mo is deposited on the surface of the silica glass substrate by electron beam evaporation using the target 7 for electron beam evaporation and the electron gun 8 so as to form an Mo electrode layer on the substrate 18. The substrate 18 with the Mo electrode layer formed thereon is then mounted on the substrate holder 2 in the thin film producing chamber 20. Then, a semiconductor device with $CuInSe_{2-x}P_x/CuInSe_2$, $CuInSe_{2-x}Sb_x/CuInSe_2$, or $CuInSe_{2-x}Bi_x/CuInSe_2$ thin film p-n homojunction is fabricated in the following procedure.

First, an n-type $CuInSe_2$ layer of a thickness of about $5 \times 10^{-7}$ m and then a $CuInSe_{2-x}P_x$, $CuInSe_{2-x}Sb_x$, or $CuInSe_{2-x}Bi_x$ layer of a thickness of about $10^{-6}$ m are formed on the Mo electrode layer in this order. As the molecular beam sources 3 or ion beam sources 4 for Cu, In, Se, and P, Sb, or Bi solid Knudsen cells, gas Knudsen cells, liquid source utilizing vapor pressure, or halogenated metals can be used. In this example, Cu, In, and Se metals are used for the respective molecular beam sources 3. Each metal is evaporated by heating. A cover having a small hole is placed on each source 3 so that the metal vapor is injected through the hole directly to the surface of the substrate 18 on the holder 2. A shutter 21 is formed between the substrate 18 and each source 3.

Yellow phosphorous is used for the P ion beam source 4. For the Sb or Bi ion beam source 4, the chloride thereof is used. Such material is heated and subjected to repeated electron bombardments so as to produce high-density plasma. The plasma is converged and the ions in the plasma are accelerated by a two-stage lens system, followed by mass separation through a fan-shaped magnetic field to select $P^+$, $Sb^+$, or $Bi^+$ ions from the ions in the plasma, which are then converged by a multi-stage lens system and soon decelerated. The decelerated P, Sb, or Bi ion beams scan over the surface of the substrate 18.

When the $CuInSe_{2-x}P_x$, $CuInSe_{2-x}Sb_x$, or $CuInSe_{2-x}Bi_x$ layer and the $CuInSe_2$ layer are formed sequentially, switching on/off of the P, Sb, or Bi ion beam source 4, adjustment of the intensity of Cu, In, and Se molecular beams, and adjustment of the temperature of the substrate holder 2 are rquired. On the other hand, when the $CuInSe_2$ layer has been formed previously or a $CuInSe_2$ single crystal layer is used as the substrate 18, the $CuInSe_{2-x}P_x$, $CuInSe_{2-x}Sb_x$, or $CuInSe_{2-x}Bi_x$ layer of a desired thickness must be formed in the surface region of the $CuInSe_2$ layer. In this case, the acceleration energy of P, Sb, or Bi ion beams can be increased at the final stage of the lens system to reach an appropriate acceleration energy corresponding to a projection range where a desired thickness of the $CuInSe_{2-x}P_x$, $CuInSe_{2-x}Sb_x$, or $CuInSe_{2-x}Bi_x$ layer can be formed in the $CuInSe_2$ layer. For example, to make the p-type layer having a thickness of about $10^{-6}$ m, the acceleration energy is increased to about $10^4$–$10^5$ electron volts. In this example, the acceleration energy of P, Sb, or Bi ions was 50 electron volts, and the temperature of the substrate holder 2 was raised to 650 K. and 750 K. for the formation of the $CuInSe_2$ layer and the $CuInSe_{2-x}P_x$, $CuInSe_{2-x}Sb_x$, or $CuInSe_{2-x}Bi_x$ layer, respectively. The intensity of Cu, In, and Se molecular beams was adjusted by adjusting the temperature of the respective Knudsen cells in the range of 1400–1450 K., 1100–1150 K., and 400–450 K., respectively. The intensity of molecular beams were monitored by an ion monitor which provided more precise results than a film thickness meter using a quartz oscillator.

A ZnO layer is used as both a transparent electrode layer and a protective layer for the p-type $CuInSe_{2-x}P_x$, $CuInSe_{2-x}Sb_x$, or $CuInSe_{2-x}Bi_x$ layer that is to be a light absorption layer. The ZnO transparent electrode layer is formed on the surface of the $CuInSe_{2-x}P_x$, $CuInSe_{2-x}Sb_x$, or $CuInSe_{2-x}Bi_x$ layer by sputtering the target 5 for ZnO with Ar ions from the ion gun 6. Likewise, an ITO transparent electrode layer is formed on the ZnO layer by sputtering the target for ITO with Ar ions from the ion gun 6. Then, the resultant multilayer structure is placed in the sample treatment sub-chamber 17 for heat treatment at a temperature of 400 K. for one hour with $10^{-5}$ millibars of oxygen supplied therein.

Figure 8:
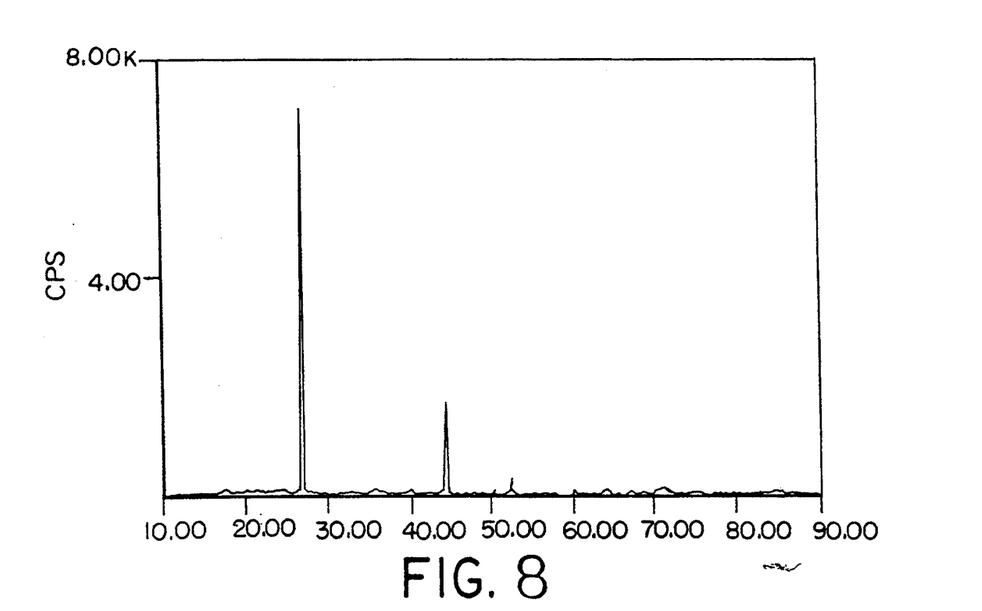
FIG. 8 is an X-ray diffraction diagram of CuInSe$_{2-x}$P$_x$ produced according to the method of the present invention.
Figure 9:
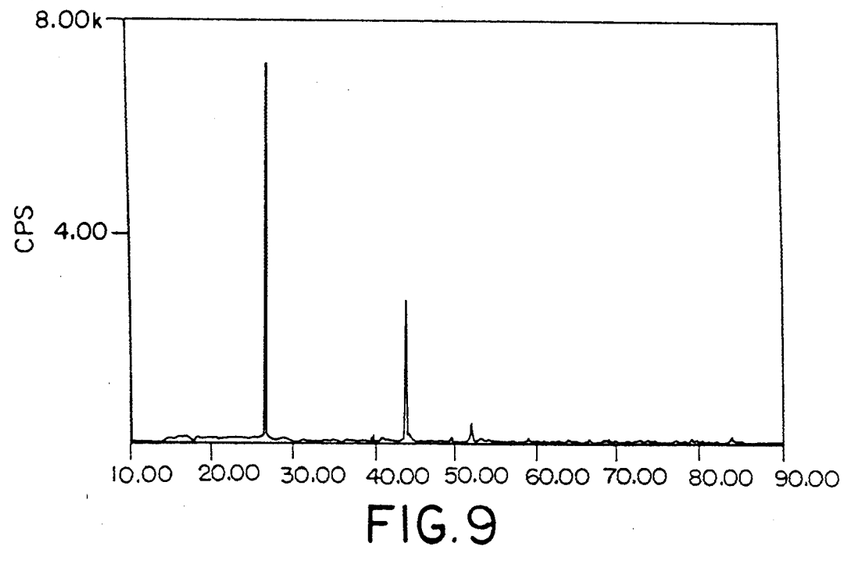
FIG. 9 is an X-ray diffraction diagram of CuInSe$_{2-x}$Sb$_x$ produced according to the method of the present invention.
Figure 10:
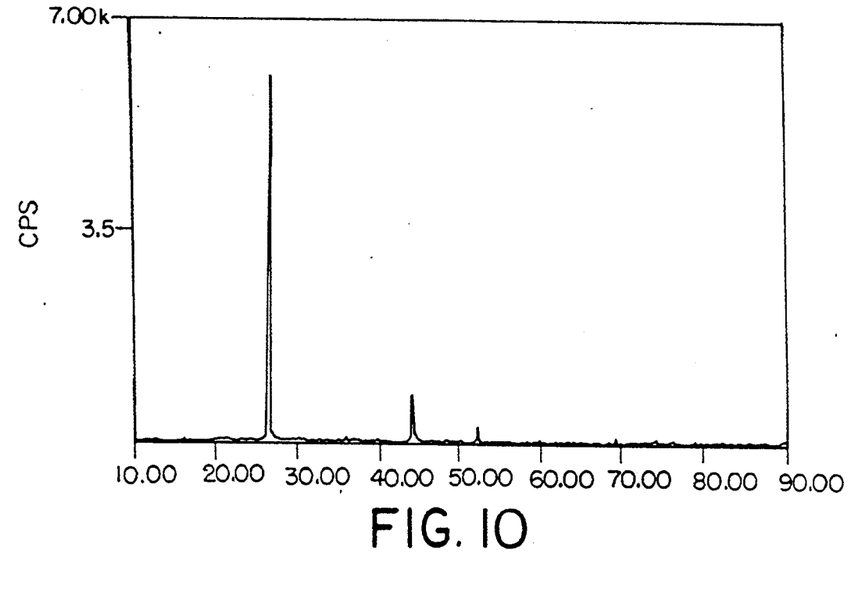
FIG. 10 is an X-ray diffraction diagram of CuInSe$_{2-x}$Bi$_x$ produced according to the method of the present invention.

FIGS. 8 to 10 respectively shown an Xray diffraction diagram of $CuInSe_{2-x}P_x$, $CuInSe_{2-x}Sb_x$, and $CuInSe_{2-x}Bi_x$, respectively. It is shown from these figures that the compound semiconductor thin film obtained by the method described above has the lattice constants matching with each other at the junction formed in the same crystal structure, and is free from segregation of intermetallic compounds and production of different types of compounds from the chalcopyrite structure.

Table 2 below shows the conductivity and the conductivity type of each of Sample A ($CuInSe_{2-x}P_x$), B ($CuInSe_{2-x}Sb_x$), C ($CuInSe_{2-x}Bi_x$), and D ($CuInSe_2$). This table shows that, while the stoichiometric $CuInSe_2$ chalcopyrite compound is of n-type having a high resistance, the $CuInSe_{2-x}P_x$, $CuInSe_{2-x}Sb_x$, and $CuInSe_{2-x}Bi_x$ that are also stoichiometric chalcopyrite compounds are of p-type with a low resistance by the partial replacement of Se with P, Sb, and Bi, respectively.

TABLE 2

|  | Conductivity (/Ωcm) | Conductivity type |
| --- | --- | --- |
| Sample A | 0.33 | p-type |
| Sample B | 0.022 | p-type |
| Sample C | 0.025 | p-type |
| Sample D | $1.3 \times 10^{-4}$ | n-type |

Example 3

In this example, a p-$CuInSe_2$ chalcopyrite compound semiconductor is used, and an n-$CuInSe_{2-x}Cl_x$ thin film is produced by the partial replacement of Se (a VI-group element) in the $CuInSe_2$ with Cl (a VII-group element).

FIG. 2 shows an apparatus for producing the compound semiconductor thin films and the compound semiconductor devices of this example according to the present invention. The apparatus comprises an ultrahigh vacuum chamber 1 composed of four sub-chambers. One of the sub-chambers is a thin film producing chamber 20 which includes a substrate holder 2 capable of being heated and cooled, and molecular beam sources 3 and an ion source 4 for I, III, VI, and VII group elements that are components of the I-III-$VI_{2-x}$-$VIII_x$ compound semiconductor thin film (in this example, Cu, In, Se, and Cl, respectively). The vacuum chamber 1 also includes components required for film formation by sputtering and electron beam irradiation to fabricate a semiconductor device. These components include a target 5 for sputtering, an ion gun 6, a target 7 for electron beam evaporation, an electron gun 8, another electron gun 9 for thin film monitoring, a fluorescent screen 10, an electron energy analyzer 11, an X-ray source 12, an ion gun 13, a mass analyzer 14, a laser light source 15, a spectroscope 16, and an atmospherically controlled sample treatment sub-chamber 17.

The base pressure in the ultra-high vacuum chamber 1 is lowered to $10^{-10}$ millibars by using a rotary pump, an oil diffusion pump, an ion pump, a turbo pump, a Ti sublimation pump, and the like jointly. Silica glass of which surface is degreased and cleaned is used as a substrate 18. Mo is deposited on the surface of the silica glass substrate by electron beam evaporation using the target 7 for electron beam evaporation and the electron gun 8 so as to form an Mo electrode layer on the substrate 18. The substrate 18 with the Mo electrode layer formed thereon is then mounted on the substrate holder 2 in the thin film producing chamber 20. Then, a semiconductor device with $CuInSe_{2-x}Cl_x/CuInSe_2$ thin film n-p homojunction is fabricated in the following procedure.

First, a p-type $CuInSe_2$ layer of a thickness of about $5\times 10^{-7}$ m and then an n-type $CuInSe_{2-x}Cl_x$ layer of a thickness of about $10^{-6}$ m are formed on the Mo electrode layer in this order. As the molecular beam sources 3 or ion beam sources 4 for Cu, In, Se, and Cl, solid Knudsen cells, gas Knudsen cells, liquid source utilizing vapor pressure, or halogenated metals can be used. In this example, Cu, In, and Se metals are used for the respective molecular beam sources 3. Each metal is evaporated by heating. A cover having a small hole is placed on each source 3 so that the metal vapor is injected through the hole directly to the surface of the substrate 18 on the holder 2. A shutter 21 is formed between the substrate 18 and each source 3.

A metal chloride is used for the Cl ion beam source 4. The gas is heated and subjected to repeated electron bombardments so as to produce high-density plasma. The plasma is converged and the ions in the plasma are accelerated by a two-stage lens system, followed by mass separation through a fan-shaped magnetic field to select $Cl^+$ ions from the ions in the plasma, which are then converged by a multi-stage lens system and soon decelerated. The decelerated Cl ion beams scan over the surface of the substrate 18.

When the $CuInSe_{2-x}Cl_x$ layer and the $CuInSe_2$ layer are formed sequentially, switching on/off of the Cl ion beam source 4, adjustment of the intensity of Cu, In, and Se molecular beams, and adjustment of the temperature of the substrate holder 2 are required. On the other hand, when the p-$CuInSe_2$ layer has been formed previously or a p-$CuInSe_2$ single crystal layer is used as the substrate 18, the n-$CuInSe_{2-x}Cl_x$ layer of a desired thickness must be formed in the surface region of the $CuInSe_2$ layer. In this case, the acceleration energy of Cl ion beams can be increased at the final stage of the lens system to reach an appropriate acceleration energy corresponding to a projection range where a desired thickness of the $CuInSe_{2-x}Cl_x$ layer can be formed in the $CuInSe_2$ layer. For example, to make the p-type layer having a thickness of about $10^{-6}$ m, the acceleration energy is increased to about $2\times 10^4$ electron volts. In this example, the acceleration energy of Cl ions was 50 electrons volts, and the temperature of the substrate holder 2 was raised to 650 K. and 750 K. for the formation of the $CuInSe_2$ layer and the $CuInSe_{2-x}Cl_x$ layer, respectively. The intensity of Cu, In, and Se molecular beams was adjusted by adjusting the temperature of the respective Knudsen cells in the range of 1400–1450 K., 1100–1150 K., and 400–450K., respectively. The intensity of molecular beams were monitored by an ion monitor which provided more precise results than a film thickness meter using a quartz oscillator.

A ZnO layer is used as both a transparent electrode layer and a protective layer for the n-type $CuInSe_{2-x}Cl_x$ layer that is to be a light absorption layer. The ZnO transparent electrode layer is formed on the surface of the $CuInSe_{2-x}Cl_x$ layer by sputtering the target 5 for ZnO with Ar ions from the ion gun 6. Likewise, an ITO transparent electrode layer is formed on the ZnO layer by sputtering an target for ITO with Ar ions from the ion gun 6. Then, the resultant multi-layer structure is placed in the sample treatment sub-chamber 17 for heat treatment at a temperature of 400 K. for one hour with $10^{-5}$ millibars of oxygen supplied therein.

Figure 11:
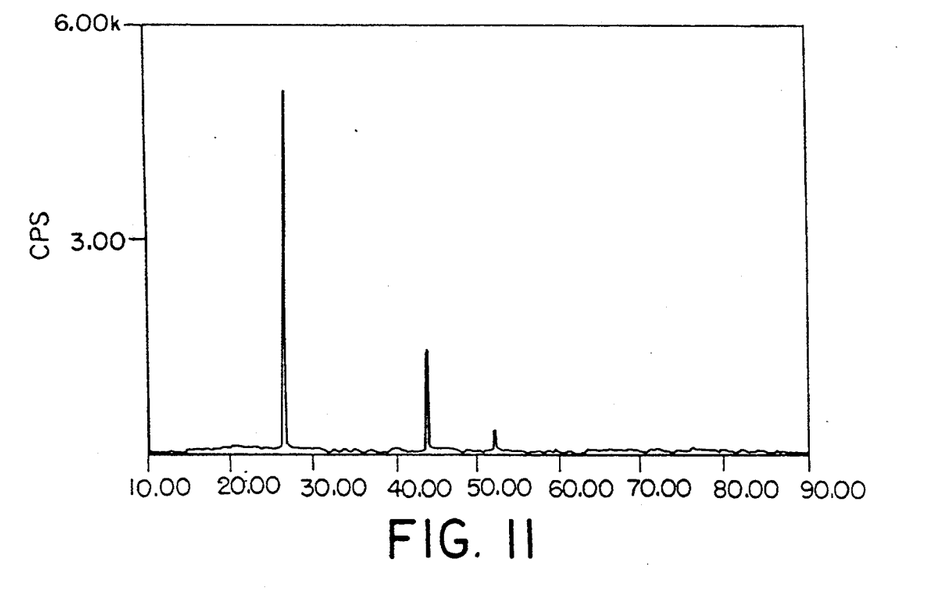
FIG. 11 is an X-ray diffraction diagram of CuInSe$_{2-x}$Cl$_x$ produced according to the method of the present invention.

FIG. 11 shows an X-ray diffraction diagram and $CuInSe_{2-x}Cl_x$. It is shown from these figures that the compound semiconductor thin film obtained by the method described above has the lattice constants matching with each other at the junction formed in the same crystal structure, and is free from segregation of intermetallic compounds and production of different types of compounds from the chalcopyrite structure.

Table 3 below shows the conductivity and the conductivity type of each Sample A ($CuInSe_{2-x}Cl_x$) and Sample B ($CuInSe_2$). This table shows that, while the stoichiometric $CuInSe_2$ chalcopyrite compound is of p-type having a low resistance, the $CuInSe_{2-x}Cl_x$ that is also a stoichiometric chalcopyrite compound having a slightly increased amount of Cu is of n-type with a low resistance by the partial replacement of Se with Cl.

TABLE 3

|  | Conductivity (/Ωcm) | Conductivity type |
|---|---|---|
| Sample A | .17.62 | n-type |
| Sample B | 24.79 | p-type |

The thin films produced according to the method of the present invention have good orientation on the crystal surface, the lattice constants of the films at the p-n homojunction therebetween can be matched with each other, and the number of defects produced at the junction can be reduced. Further, segregation of excessive components, production of different types of compounds, or other phenomena that may badly affect the electric properties of the resultant device are avoided. Therefore, highly efficient solar cells can be obtained.

Example 4

In this example, a semiconductor device having a homojunction of I-III-$VI_{2-x}V_x$ and I-III-$VI_{2-x}VII_x$ chalcopyrite compounds is described, using p-$CuInSe_{2-x}N_x$ and n-$CuInSe_{2-x}Cl_x$ as respective examples.

FIG. 2 shows an apparatus for producing the compound semiconductor thin films and the compound semiconductor devices of this example according to the present invention. The apparatus comprises an ultra-high vacuum chamber 1 composed of four sub-chambers. One of the sub-chambers is a thin film producing chamber 20 which includes a substrate holder 2 capable of being heated and cooled, and molecular beam sources 3 and an ion source 4 for I, III, VI, V, and VII group elements that are components of the I-III-$VI_{2-x}V_x$ and I-III-$VI_{2-x}VII_x$ compound semiconductor thin films (in this example, Cu, In, Se, N and Cl, respectively). The vacuum chamber 1 also includes components required for film formation by sputtering and electron beam irradiation to fabricate a semiconductor device. These components include a target 5 for sputtering, an ion gun 6, a target 7 for electron beam evaporation, an electron gun 8, another electron gun 9 for thin film monitoring, a fluorescent screen 10, an electron energy analyzer 11, an X-ray source 12, an ion gun 13, a mass analyzer 14, a laser light source 15, a spectroscope 16, and an atmospherically controlled sample treatment sub-chamber 17.

The base pressure in the ultra-high vacuum chamber 1 is lowered to $10^{-10}$ millibars by using a rotary pump, an oil diffusion pump, an ion pump, a turbo pump, a Ti sublimation pump, and the like jointly. Silica glass of which surface is degreased and cleaned is used as a substrate 18. Mo is deposited on the surface of the silica glass substrate by electron beam evaporation using the target 7 for electron beam evaporation and the electron gun 8 so as to form an Mo electrode layer on the substrate 18. The substrate 18 with the Mo electrode layer formed thereon is then mounted on the substrate holder 2 in the thin film producing chamber 20. Then, a semiconductor device with $CuInSe_{2-x}N_x/CuInSe_{2-x}Cl_x$ thin film p-n homojunction is fabricated in the following procedure.

First, an n-type $CuInSe_{2-x}Cl_x$ layer of a thickness of about $5 \times 10^{-7}$ m and then a $CuInSe_{2-x}N_x$ layer of a thickness of about $10^{-6}$ m are formed on the Mo electrode layer in this order.

Since stoichiometric $CuInSe_2$ compounds are not good in adhesion to the Mo electrode layer, generally, a p-type $CuInSe_2$ layer having a slightly increased amount of Cu is first formed on the Mo electrode layer, and then an n-type $CuInSe_2$ layer is formed on the p-type layer, thus to obtain the n-p junction. However, this method is not so good because it has many restrictions in the manufacturing process such as the temperature at the film formation, as well as in the structure of the device. According to the present invention, a $CuInSe_2$ layer having a slightly increased amount of Cu is formed on the Mo electrode layer, as in the conventional method, so as to obtain a good adhesion to the Mo electrode layer. At the same time, however, Se in a portion of the $CuInSe_2$ layer is partially replaced with Cl, converting the portion to the n-type. Thus, the above restrictions can be markedly reduced.

As the molecular beam sources 3 or ion beam sources 4 for Cu, In, Se, N and Cl, solid Knudsen cells, gas Knudsen cells, liquid source utilizing vapor pressure, or halogenated metals can be used. In this example, Cu, In, and Se metals are used for the respective molecular beam sources 3. Each metal is evaporated by heating. A cover having a small hole is placed on each source 3 so that the metal vapor is injected through the hole directly to the surface of the substrate 18 on the holder 2. A shutter 21 is formed between the substrate 18 and each source 3.

Nitrogen gas is used for the N ion beam source 4. The gas is heated and subjected to repeated electron bombardments so as to produce high-density plasma. A metal chloride is used for the Cl ion beam source. The metal chloride is heated and subjected to repeated electron bombardments so as to produce high-density plasma. The plasma is converged and the ions in the plasma are accelerated by a two-stage lens system, followed by mass separation through a fan-shaped magnetic field to select N+ and Cl+ ions from the ions in the plasma, which are then converged by a multi-stage lens system and soon decelerated. The decelerated N ion beams scan over the surface of the substrate 18.

Since the $CuInSe_{2-x}N_x$ layer and the $CuInSe_{2-x}Cl_x$ layer are formed sequentially, switching on/off of the N and Cl ion beam sources 4, adjustment of the intensity of Cu In, and Se molecular beams, and adjustment of the temperature of the substrate holder 2 are required. On the other hand, when the $CuInSe_2$ layer has been formed previously or a $CuInSe_2$ single crystal layer is used as the substrate 18, the $CuInSe_{2-x}N_x$ and $CuInSe_{2-x}Cl_x$ layers of a desired thickness must be formed in the surface region of the $CuInSe_2$ layer. In this case, each acceleration energy of N and Cl ion beams can be increased at the final stage of the lens system to reach an appropriate acceleration energy corresponding to a projection range where a desired thickness of the $CuInSe_{2-x}N_x$ and $CuInSe_{2-x}Cl_x$ layer can be formed in the $CuInSe_2$ layer. For example, to make the n-type layer having a thickness of about $10^{-6}$ m, the acceleration energy is increased to about $10^5$ electron volts to dope with Cl. To make the p-type layer having a thickness of about $10^{-6}$ m, the acceleration energy is increased to about $10^4$ electron volts to dope with N. In this example, the acceleration energy of both N and Cl ions was 50 electron volts, and the temperature of the substrate holder 2 was raised to 650 K. and 750 K. for the formation of the $CuInSe_{2-x}N_x$ and $CuInSe_{2-x}Cl_x$ layers, respectively. The intensity of Cu, In, and Se molecular beams was adjusted by adjusting the temperature of the respective Knudsen cells in the range of 1400–1450 K., 1100–1150 K., and 400–450 K., respectively. The intensity of molecular beams were monitored by an ion monitor which provided more precise results than a film thickness meter using a quartz oscillator.

Example 5

As mentioned in Example 4, a I-III-VI$_2$ chalcopyrite compound semiconductor thin film is not good in adhesion to a substrate made of glass or a metal film formed on a glass substrate. This raises a big problem at the fabrication of practical semiconductor devices. This example shows the use of rare gas ions to solve this problem.

In this example, a stoichiometric $CuInSe_2$ chalcopyrite compound semiconductor and Ar are used to describe that the adhesion of a $CuInSe_2$ layer to a silica glass substrate or an Mo electrode is improved by irradiation of a VIII-group element ions.

FIG. 2 shows an appparatus for producing the compound semiconductor thin films and the compound semiconductor devices of this example according to the present invention. The apparatus comprises and ultra-high vacuum chamber 1 composed of four sub-chambers. One of the sub-chambers is a thin film producing chamber 20 which includes a substrate holder 2 capable of being heated and cooled, and molecular beam sources 3 and an ion source 4 for I, III, VI, and VIII group elements that are components of the I-III-VI$_2$ compound semiconductor thin film (in this example, Cu, In, Se, and Ar, respectively). The vacuum chamber 1 also includes components required for film formation by sputtering and electron beam irradiation to fabricate a semiconductor device. These components include a target 5 for sputtering, an ion gun 6, a target 7 for electron beam evaporation, an electron gun 8, another electron gun 9 for thin film monitoring, a fluorescent screen 10, an electron energy analyzer 11, an X-ray source 12, an ion gun 13, a mass analyzer 14, a laser jlight source 15, a spectroscope 16, and an atmospherically controlled sample treatment sub-chamber 17.

The base pressure in the ultra-high vacuum chamber 1 is lowered to $10^{-10}$ millibars by using a rotary pump, an oil diffusion pump, an ion pump, a turbo pump, a Ti sublimation pump, and the like jointly. Silica glass of which surface is degreased and cleaned is used as a substrate 18. Mo is deposited on the surface of the silica glass substrate by electron beam evaporation using the target 7 for electron beam evaporation and the electron gun 8 so as to form an Mo electrode layer on the substrate 18. The substrate 18 with the Mo electrode layer formed thereon is then mounted on the substrate holder 2 in the thin film producing chamber 20. Then, a semiconductor device with $CuInSe_2$ thin film p-n homojunction is fabricated in the following procedure.

First, an n-type $CuInSe_2$ layer of a thickness of about $5 \times 10^{-7}$ m and then a p-type $CuInSe_2$ layer of a thickness of about $10^{-6}$ m are formed on the Mo electrode layer in this order.

Figure 12:
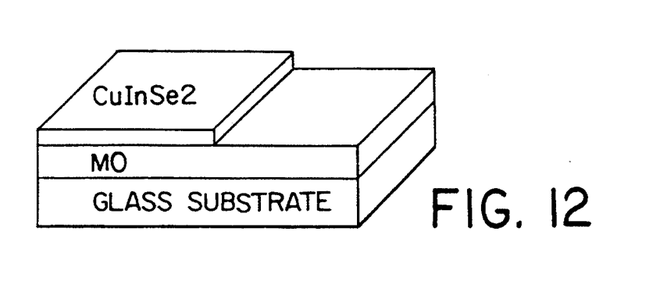
FIG. 12 shows the result of an adhesive tape peeling-off test for a stoichiometric CuInSe$_2$ thin film produced according to the method of the present invention.

Since stoichiometric $CuInSe_2$ compounds are not good in adhesion to the Mo electrode layer, generally, a p-type $CuInSe_2$ layer having a slightly increased amount of Cu is first formed on the Mo electrode layer, and then an n-type $CuInSe_2$ layer is formed on the p-type layer, thus to obtain the n-p junction. However, this method is not so good because it has many restrictions in the manufacturing process such as the temperature at the film formation as well as in the structure of the device. According to the present invention, after the stoichiometric $CuInSe_2$ layer is formed on the Mo electrode layer, Ar ion beams having an acceleration energy of several tens of thousands of electron volts are radiated to the $CuInSe_2$ layer. By this Ar irradiation, the adhesion of the stoichiometric $CuInSe_2$ layer to the silica glass or the Mo electrode is improved as shown in FIG. 12 illustrating the result of an adhesion tape peeling-off test. As a result, the subsequent formation of the p-type layer can be easily performed, and the aforementioned restrictions in the fabricating process and the structure are markedly reduced.

Example 6

As described with regard to the prior art, conventional solar cells include the $CuInSe_2/Cds$ heterojunction. Since Cd is toxic, using Cd raises an environmental problem. Also, since the lattice constants at the heterojunction do not match with each other, recombination centers are produced. As a result, the properties, e.g., the energy efficiency, of the solar cells are degraded. This example describes a novel pollution-free, high-performance solar cell structure. The solar cell excludes the use of Cd and solves the aforementioned problems by forming a homojunction of a $I-III-VI_2$ chalcopyrite compound semiconductor thin film. In this example, $CuInSe_2$ is used as a typical example of $I-III-VI_2$.

Figure 13:
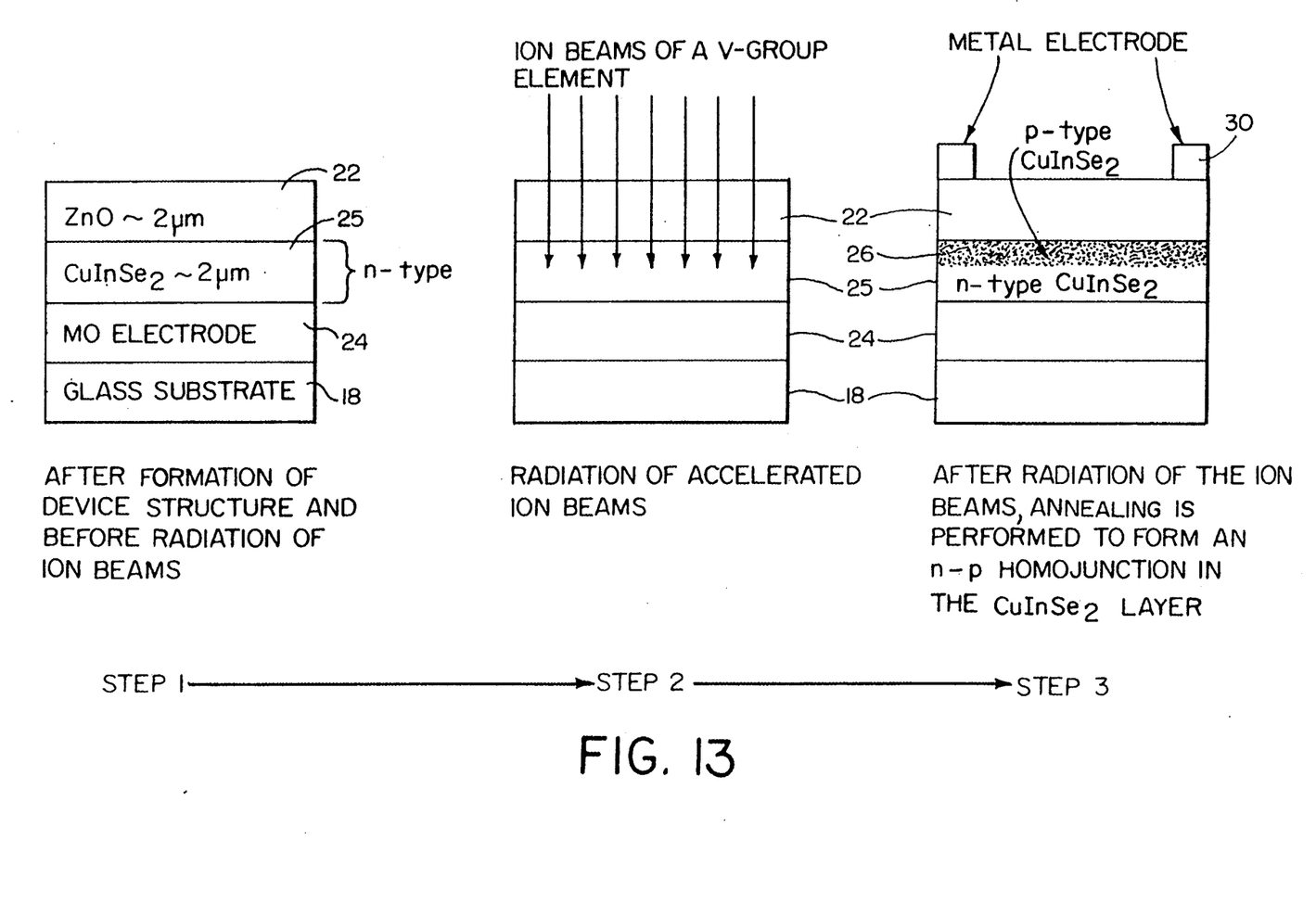
FIG. 13 shows the structure of a pollution-free, high-performance homojunction CuInSe$_2$ solar cell and a method for producing same.

FIG. 13 shows a fabricating process of the solar cells. First, a structure of a transparent or non-transparent substrate 18, a lower metal electrode 24 made of Mo, for example, a $CuInSe_2$ chalcopyrite thin film 15, and a transparent electrode 22 made of a material such as ZnO or $In_2O_3$ in this order is formed.

Then, accelerated ion beams of a V-, VII-, or VIII-group element are used to form a homojunction in the chalcopyrite thin film. The acceleration energy of the ion beams is adjusted so that the ion beams pass through the top transparent electrode 22 and then pass in the chalcopyrite thin film 25 until it reaches a certain depth thereof where a homojunction between a p-type chalcopyrite thin film 26 and the n-type chalcopyrite rilm 25 should be formed. The dose of ions should be such an amount that the conductivity type in the ion implanted region can be converted. This indicates that the dose of ions depends on the crystallinity of the initial chalcopyrite thin film 25. In order to effect the conversion of the conductivity type, when the initial chalcopyrite thin film 25 is of n-type, accelerated ion beams of a V-group element are used. On the contrary, when the chalcopyrite thin film 25 is of p-type, accelerated ion beams of a VII-group element are used. In the latter case, ion beams of a VIII-group element can also be used.

Incidentially, the formation of the homojunction in the chalcopyrite thin films 25 and 26 by using ion beams of a V or VII group element is performed by doping. On the contrary, that by using ion beams of a VIII group element is performed by using the donar type crystal defects or Se vacancies formed at the ion implantation. The projection range of the distribution of the crystal defects formed at the ion implantation is smaller than that of the distribution of the implanted elements. Therefore, when ions of a VIII-group element are installed into the p-type chalcopyrite thin film to form a homojunction, a greater acceleration energy is required, compared with the doping of V or VII group element.

Annealing is required after the ion implantation as a step of the doping process. The conditions for annealing vary depending on the acceleration energy at the ion implantation, the dose of ions, the crystallinity of the intitial chalcopyrite thin film, and other conditions. Obviously, the description of this example is also applicable to the case of the reverse structure of the device.

Thus, according to the present invention, novel chalcopyrite compound semiconductors represented by $I-III-VI_{2-x}V_x$ and $I-III-VI_{2-x}VII_x$ can be provided.

It is known that it is difficult to obtain stoichiometric $I-III-VI_2$ chalcopyrite compound semiconductor thin films with p-type conductivity. This relates to the fact that the electron structure of the $I-III-VI_2$ chalcopyrite compounds is basically dominated by the d-p hybridized orbital of I- and VI-group elements. If VI-group atoms that determine the highest occupies level are replaced with V-group atoms, holes are produced in the valence band. In other words, stoichiometric $I-III-VI_{2-x}V_x$ chalcopyrite compound semiconductors are of p-type conductivity. Accordingly, by the partial replacement of VI-group atoms of $I-III-VI_2$ with V-group atoms, the conductivity type is converted from n to p.

Likewise, in the $I-III-VI_{2-x}VII_x$ chalcopyrite compound semiconductors, free electrons are introduced into the lower portion of the conduction band, thus to provide the n-type conductivity. Thus, the p/n conductivity type control is possible by the partial replacement of VI-group atoms of $I-III-VI_2$ with V-group or VII-group atoms. In this way, the lattice constant is matched at the p-n junction in the same crystal structure, and the number of defects produced at the p-n junction is reduced, whereby deterioration of the properties of devices such as solar cells ane optical detectors is minimized.

Further, it is possible to stoichiometrically control the metal components contained in the chalcopyrite compound semiconductor thin films and to control the conductivity type thereof by only the partial replacement of the VI-group atoms in the crystal structure. Therefore, segregating of excessive metal components and intermetallic compounds produced therefrom, production of different types of compounds from the chalcopyrite structure, or other phenomena badly affecting the electrical properties of the semiconductor devices can be avoided. In this way, the properties of various semiconductor devices using the chalcopyrite compound semiconductor thin films of the present invention can be improved. This will also lead to the possibility of novel devices having new structure such as double-hetero and triple-hetero.

Moreover, the stoichiometric I-III-VI$_2$ chalcopyrite compound thin film can be formed on a substrate with good adhesion by using accelerated ion beams of a VIII group element. Therefore, restrictions in the fabricating process of the compound semiconductor device as well as the structure thereof are greatly reduced.

Furthermore, after the fabrication of an optoelectro transducer, a homojunction can be formed in the chalcopyrite thin film by using accelerated ion beams. By using this method, conventional problems such as I-III-VI$_{2-x}$V$_x$, I-III-VI$_{2-x}$VII$_x$, failure in the lattice matching at the heterojunction and the resultant production of recombination centers can be solved. Also, according to this method, solar cells can be fabricated without using toxic Cd. Thus, the present invention can contribute to energy saving and environmental protection.

Various other modifications will be apparent to and can be readily made by those skilled in the art without departing from the scope and spirity of this invention. Accordingly, it is not intended that the scope of the claims appended hereto be limited to the description as set forth herein, but rather that the claims be broadly construed.

What is claimed is:

1. A method for producing a compound semiconductor thin film comprising the step of forming a chalcopyrite thin film represented by I-III-VI$_2$ over a substrate in a vacuum chamber by use of molecular beams or ion beams of I, III, VI, and VIII group elements.

2. A method for fabricating an optoelectro transducer comprising the steps of:
    forming an electrode over an opaque substrate;
    forming a chalcopyrite thin film represented by I-III-VI$_2$ on the electrode;
    forming a transparent electrode on the chalcopyrite thin film; and
    forming a homojunction in the chalcopyrite thin film by doping the chalcopyrite thin film with ions of an element which is selected from the group of a V, VII, or VIII group element.

3. A method for fabricating an optoelectro transducer comprising the stepss of:
    forming a transparent electrode over the transparent substrate;
    forming a chalcopyrite thin film represented by I-III-VI$_2$ on the transparent electrode;
    forming an electrode on the chalcopyrite thin film; and
    forming a homojunction in the chalcopyrite thin film by doping the chalcopyrite thin film with ions of an element which is selected from the group of a V, VII, or VIII group element.

4. A method for producing a compound semiconductor thin film comprising the step of forming a chalcopyrite thin film, represented by I-III-VI$_2$ in which some of the VI atoms are replaced by V atoms, over a substrate in a vacuum chamber by use of beams of I, III, VI, and V group elements.

5. A method according to claim 4, wherein said step of forming the chalcopyrite thin film is carried out by use of molecular beams of I, III and VI group elements and an ion beam of a V group element.

6. A method according to claim 4, wherein said step of forming the chalcopyrite thin film comprises the steps of:
    forming a first chalcopyrite thin film, represented by I-III-VI$_2$, over the substrate by use of molecular beams of I, III, and VI group elements; and
    forming a second chalcopyrite thin film, represented by I-III-VI$_2$ in which some of the VI atoms are replaced with V atoms, in the first chalcopyrite thin film by doping the first chalcopyrite thin film with a V group element by use of an ion beam of the V group element.

7. A method for producing a compound semiconductor thin film comprising the step of forming a chalcopyrite thin film, represented by I-III-VI$_2$ in which some of the VI atoms are replaced with VII atoms, on a substrate in a vacuum chamber by use of beams of I, III, VI, and VIII group elements.

8. A method according to claim 7, wherein said step of forming the chalcopyrite thin film is carried out by use of molecular beams of I, III and VI group elements and an ion beam of a VII group element.

9. A method according to claim 7, wherein said step of forming the chalcopyrite thin film comprises the steps of:
    forming a first chalcopyrite thin film represented by I-III-VI$_2$ over the substrate by use of molecular beams of I, III and VI group elements; and
    forming a second chalcopyrite thin film, represented by I-III-VI$_2$ in which some of the VI atoms are replaced by VII atoms, in the first chalcopyrite thin film by doping the first chalcopyrite thin film with a VII group element by use of an ion beam of the VII group element.

* * * * *